(12) United States Patent
Gosset et al.

(10) Patent No.: US 8,399,772 B2
(45) Date of Patent: Mar. 19, 2013

(54) CONTROL OF CARBON NANOSTRUCTURE GROWTH IN AN INTERCONNECT STRUCTURE

(75) Inventors: Laurent Gosset, Grenoble (FR); Joaquin Torres, Saint Martin le Vinoux (FR)

(73) Assignee: NXP B.V., Eindhoven (NL)

( * ) Notice: Subject to any disclaimer, the term of this patent is extended or adjusted under 35 U.S.C. 154(b) by 541 days.

(21) Appl. No.: 12/439,919

(22) PCT Filed: Aug. 29, 2007

(86) PCT No.: PCT/EP2007/058999
§ 371 (c)(1),
(2), (4) Date: Mar. 4, 2009

(87) PCT Pub. No.: WO2008/028851
PCT Pub. Date: Mar. 13, 2008

(65) Prior Publication Data
US 2009/0272565 A1 Nov. 5, 2009

(30) Foreign Application Priority Data
Sep. 4, 2006 (EP) .................................... 06300922

(51) Int. Cl.
*H05K 1/00* (2006.01)
*H05K 1/11* (2006.01)
*H05K 1/16* (2006.01)
(52) U.S. Cl. ......... 174/250; 174/262; 174/260; 174/265
(58) Field of Classification Search .................. 174/250, 174/260–266, 257; 361/792–795; 977/742, 977/762; 257/E21.586, 762, 774, 776
See application file for complete search history.

(56) References Cited

U.S. PATENT DOCUMENTS

| | | | | |
|---|---|---|---|---|
| 5,362,677 A | * | 11/1994 | Sakamoto et al. | 438/167 |
| 5,480,843 A | * | 1/1996 | Park et al. | 216/11 |
| 5,702,281 A | * | 12/1997 | Huang et al. | 445/50 |
| 5,899,741 A | * | 5/1999 | Tseng et al. | 438/649 |
| 5,976,970 A | | 11/1999 | Dalal et al. | |
| 6,140,227 A | | 10/2000 | Chen et al. | |
| 6,204,102 B1 | * | 3/2001 | Yoon et al. | 438/182 |
| 6,291,333 B1 | * | 9/2001 | Lou | 438/618 |
| 6,448,701 B1 | * | 9/2002 | Hsu | 313/309 |
| 6,518,166 B1 | * | 2/2003 | Chen et al. | 438/622 |

(Continued)

FOREIGN PATENT DOCUMENTS

| EP | 1324383 A2 | * 7/2003 |
|---|---|---|
| EP | 1372191 A2 | 12/2003 |

(Continued)

*Primary Examiner* — Timothy Thompson
*Assistant Examiner* — Sherman Ng (57) ABSTRACT

An interconnect structure on a substrate is provided. The interconnect structure comprises electrically conductive interconnect elements on at least two interconnect levels on or above a substrate level. In the interconnect structure of the invention, at least one electrically conductive via connects a first interconnect element on one interconnect level or on the substrate level to a second interconnect element on a different interconnect level. The via extends in a via opening of a first dielectric layer and comprises an electrically conductive via material that contains electrically conductive cylindrical carbon nanostructures. At least one cover-layer segment reaches into a lateral extension of the via opening and defines a via aperture that is small enough to prevent a penetration of the carbon nanostructures through the via aperture. This structure enhances control of carbon nanostructure growth in a height direction during fabrication of the interconnect structure.

20 Claims, 4 Drawing Sheets

U.S. PATENT DOCUMENTS

| | | |
|---|---|---|
| 6,528,419 B1 * | 3/2003 | Kordic et al. .............. 438/675 |
| 6,559,546 B1 * | 5/2003 | Achuthan et al. ........... 257/758 |
| 6,614,096 B2 * | 9/2003 | Kojima et al. .............. 257/635 |
| 6,616,497 B1 * | 9/2003 | Choi et al. ................. 445/24 |
| 6,706,625 B1 * | 3/2004 | Sudijono et al. ........... 438/637 |
| 2002/0163079 A1 | 11/2002 | Awano |
| 2003/0134508 A1 * | 7/2003 | Raaijmakers et al. ....... 438/638 |
| 2004/0152240 A1 * | 8/2004 | Dangelo ..................... 438/122 |
| 2004/0201103 A1 * | 10/2004 | Yau et al. ................... 257/758 |
| 2005/0151266 A1 * | 7/2005 | Yoshizawa et al. ......... 257/774 |
| 2005/0167755 A1 * | 8/2005 | Dubin et al. ................ 257/368 |
| 2005/0189655 A1 * | 9/2005 | Furukawa et al. .......... 257/762 |
| 2005/0266627 A1 | 12/2005 | Furukawa et al. |
| 2006/0060863 A1 | 3/2006 | Lu et al. |
| 2006/0097389 A1 * | 5/2006 | Islam et al. ................. 257/734 |
| 2006/0098705 A1 * | 5/2006 | Wang et al. .............. 372/50.124 |
| 2006/0125025 A1 | 6/2006 | Kawashima et al. |
| 2007/0148963 A1 * | 6/2007 | Chan et al. ................. 438/637 |

FOREIGN PATENT DOCUMENTS

| | | |
|---|---|---|
| JP | 10012124 | 1/1998 |
| JP | 2005072171 | 3/2005 |
| WO | 2004051726 A1 | 6/2004 |
| WO | 2005069372 A1 | 7/2005 |
| WO | 2006003620 A1 | 1/2006 |
| WO | 2006038504 A1 | 4/2006 |

* cited by examiner

CONTROL OF CARBON NANOSTRUCTURE GROWTH IN AN INTERCONNECT STRUCTURE

FIELD OF THE INVENTION

The present invention relates to an interconnect structure on a substrate, comprising electrically conductive interconnect elements on at least two interconnect levels on or above a substrate level. The invention further relates to a method for fabricating an interconnect structure that has a via connecting a first electrically conductive interconnect element on one interconnect level or on the substrate level and a second interconnect element on a different interconnect level.

BACKGROUND OF THE INVENTION

Advanced generations of integrated circuit devices require interconnect structures with improved high-frequency characteristics, tolerable heat generation, and an improved heat conduction. JP-2005 072171-A proposes to use carbon nanotubes to reduce the resistance of an electrically conductive via that connects interconnect elements, such as metal lines, on different interconnect levels. Carbon nanotubes are cylindrical carbon nanostructures. Carbon nanotubes are a member of the fullerene structural family.

An implementation issue that arises when fabricating interconnect structures with electrically conductive via material that contains carbon nanotubes is the control of the via morphology, that is, in particular, the height of the via material in a via opening.

SUMMARY OF THE INVENTION

The invention has method aspects and device aspects. The following description first turns to the method aspect.

According to a first aspect of the invention a method is provided for fabricating an interconnect structure that has a via electrically connecting a first electrically conductive interconnect element on one interconnect level or on the substrate level and a second interconnect element on a different interconnect level. The method comprises the steps:

providing a substrate with the first interconnect element on one interconnect level or on the substrate level;

depositing a dielectric layer on the first interconnect element;

fabricating, in the dielectric layer, a via opening that reaches to the first interconnect element;

fabricating a cover-layer segment on the dielectric layer that reaches into a lateral extension of the via opening and defines a via aperture;

fabricating, in the via opening, an electrically conductive via material that contains electrically conductive carbon nanostructures; and fabricating a second interconnect element that contacts the via.

In the method of the first aspect of the invention, the via aperture is made small enough to prevent a penetration of the carbon nanostructures through the via aperture. Note that the term "nanostructure" will be used herein as an abbreviation for "carbon nanostructure".

The method of the invention provides an accurate process to precisely control the growth of carbon nanostructures at via area in an interconnect structure. The method is suitable for application in present-day and, in particular, upcoming processing techniques for interconnect structures at highest integration densities, such as 90, 60, and 40 nm technologies.

The method is based on constricting a lateral extension of the via opening by a cover-layer segment that reaches into the lateral extension of the via opening. Using this approach leads to a subsequent fabrication of a via material that contains the electrically conductive carbon nanostructures in a desired lateral area of the via, which is defined by an aperture given by the cover-layer segment on the dielectric layer.

Fabrication of the via material in the via opening can be performed in a height direction until the via material reaches the cover-layer segment. The height direction points from the substrate level to higher interconnect levels, and is oriented perpendicular to a substrate surface, which is assumed to be ideally flat for the purpose of the present definition.

After reaching the predefined height, the growth automatically stops because there is no room for further extension of the via material in the height direction. The height of the via material is thus limited and therefore precisely controlled by the height of the cover-layer segment above a bottom face of the via opening.

This growth limitation of the via material is due to the fact that the via aperture is made small enough to prevent a penetration of the carbon nanostructures through the via aperture.

Electrically conductive cylindrical carbon nanostructures are for instance carbon nanotubes and carbon nanowires. Carbon nanowires differ from carbon nanotubes in that they have a one-dimensional string of atoms, e.g., Carbon atoms, threaded through a carbon nanotube. Both species of nanostructures are also efficient conductors of heat, providing good high-frequency characteristics and good heat transport in a via of an interconnect structure even at a very low lateral size of the via.

The term carbon nanostructures not only covers single carbon nanotubes and single carbon nanowires, but also agglomerates of carbon nanotubes and/or carbon nanowires. For the purpose of the present invention, suitable cylindrical carbon nanostructures are also formed by carbon nanotubes or carbon nanowires, which are bent or folded, as long as such nanostructures contribute to the electrical conductivity of the via material, i.e., are able to transport electrical charge in a direction from the via bottom to the via top, or from the via top to the via bottom.

Carbon nanotubes can be fabricated in a variety of diameters. Single-walled carbon nanotubes have diameters between about 1 and 15 nm, whereas multi-walled nanotubes can have outer diameters up to about 30 nm. Furthermore, some types of cylindrical carbon nanostructures are formed by an agglomeration of carbon nanotubes or carbon nanowires. These agglomerations can form fibres with lateral extensions that exceed the lateral extension of a single carbon nanotube or carbon nanowire. It has also been demonstrated that multiple nanotubes in a via grow together to form larger single nanotubes with a diameter of several tens of nanometers.

A suitable lateral extension of the via aperture therefore depends on the type of electrically conductive cylindrical carbon nanostructures, which are fabricated with the via material in the via opening.

A simple illustrative example of a design rule for the lateral extension of the via aperture is to fabricate the via aperture smaller than an outer diameter of the cylindrical carbon nanostructures contained in the via material. If a range of diameters is present in the via material, the smallest nanostructure diameter can for example be chosen as a measure. On the other hand, it is obvious that an aperture can also be larger than the diameter of the nanostructure where at least a lateral part of the diameter of the individual nanostructures underneath the aperture is blocked by the constriction formed by the cover-layer segment.

Of course, an aperture of a certain lateral extension is required to allow the fabrication of the via material, that is, to transport reactants or precursor materials of the via material into the via opening.

The method of the invention thus allows a precise control of the morphology of the via material in the via opening. In the same way, the growth in lateral directions is controlled by the side faces of the via opening. Since the growth in height direction is controlled by the process of the present invention, there is no time limitation for lateral growth, which can thus be continued even after the desired height has been reached, until reaching a desired lateral extension.

An interconnect structure that may be fabricated as a part of an integrated-circuit device has at least two interconnect levels including the substrate level. An interconnect level is defined by a distance of an interconnect element from the substrate level. The method of the invention can thus be used for a via between an interconnect element on the substrate level and a first interconnect level above the substrate level, or between the first interconnect level and a second interconnect level above the substrate level, and so on, depending on the particular structure of the integrated-circuit device and the required interconnect structure of the integrated-circuit device.

In the following, preferred embodiments of the method of the first aspect of the invention will be described. Unless explicitly described as alternatives, the embodiments can be combined with each other.

One embodiment comprises, before the step of fabricating the via material in the via opening, a step of fabricating a catalytic layer, which is suitable for supporting growth of the carbon nanostructures on a bottom face of the via opening. The use of a catalytic layer increases the fabrication speed and enhances the control of the carbon nanostructure growth in the via opening. Examples of suitable catalyst materials will be given further below in the context of the description of the enclosed figures. In one embodiment, the catalytic layer is fabricated on only a part of the bottom face of the via opening to restrict the lateral extension of the via material in the via opening. The layer need not be contiguous, but can be separated into layer sections to promote carbon nanostructure growth at specific locations in the via opening.

There are different alternative methods for fabricating the cover-layer segment on the dielectric layer.

In a first alternative embodiment, the step of fabricating the cover-layer segment comprises non-conformally depositing a cover layer on a top face of the dielectric layer. Non-conformal deposition allows producing the cover-layer segment as an overhanging layer segment of the cover layer, laterally reaching into the lateral extension of the via opening. Suitable non-conformal deposition techniques are well known in the art. This embodiment thus comprises the fabrication of the via opening before the deposition of the cover layer.

In contrast, a second alternative method for fabricating an overhanging cover-layer structure comprises first depositing the dielectric layer and the cover layer, then forming an opening in the cover layer with the desired lateral extension, and then under-etching the cover layer during formation of the via opening. This embodiment requires an adapted process for etching the dielectric layer underlying the cover layer: for instance, $SiO_2$ dielectric material could be etched with an adapted HF-based chemistry.

Returning to the first one embodiment, the cover layer is in one variant deposited selectively on the top face of the dielectric layer, thus avoiding an undesired deposition of the cover-layer material on a bottom face of the via opening, or on a catalytic layer, which is provided in one embodiment on the bottom face of the via opening. Selective deposition is a technique that is well known in the art. In this embodiment, a dielectric liner is preferably provided on the dielectric layer for achieving selectivity. The dielectric liner is deposited before fabricating the via opening, and therefore not present inside the via opening. Deposition conditions can then be provided, which lead to a selective deposition of the cover layer only on the dielectric liner, including the formation of the overhanging cover-layer section, but not inside the via opening.

In an embodiment that forms an alternative to the selective deposition just described, a non-selective deposition is performed. This embodiment preferably comprises a step of removing cover-layer material, which has been deposited during the step of depositing the cover layer, from a bottom face of the via opening. Removal can for instance be performed by a reactive ion etching process in association with a wet dip, in order to completely recover the initial surface.

The method of the invention is preferably performed as a part of a single- or dual-damascene process. However, the method is applicable in any metallization integration scheme proposed for interconnect elements such as metal lines.

A second method aspect of the invention is formed by a method for fabricating an integrated-circuit device that includes performing the mentioned method for fabrication of an interconnect structure. The advantages of the method of the second aspect of the invention are obvious from the above description.

The following description turns to device aspects of the invention.

According to a third aspect of the invention, an interconnect structure on a substrate is provided. The interconnect structure comprises electrically conductive interconnect elements on at least two interconnect levels on or above a substrate level. In the interconnect structure of the invention, at least one electrically conductive via connects a first interconnect element on one interconnect level or on the substrate level to a second interconnect element on a different interconnect level. The via extends in a via opening of a first dielectric layer and comprises an electrically conductive via material that contains electrically conductive cylindrical carbon nanostructures. At least one cover-layer segment reaches into a lateral extension of the via opening and defines a via aperture that is small enough to prevent a penetration of the carbon nanostructures through the via aperture.

The interconnect structure of the invention has a via aperture that is smaller or equal than twice an outer cylinder diameter of carbon nanostructures in the via material. As explained before, this lateral extension of a via can prevent a growth of nanostructures beyond the cover-layer segment in a height direction where at least a part of the diameter of the carbon nanostructures is covered by the cover-layer segment.

In a further preferred embodiment, the via aperture is smaller than or equal to an outer cylinder diameter of carbon nanostructures in the via material this embodiment has a further reduced via aperture and safely restricts the growth of carbon nanostructures to the via opening.

In a further preferred embodiment, the via material in the via opening is seated on a catalytic layer, which is suitable for supporting growth of the carbon nanostructures. The advantages of this embodiment have been described before in the context of the method aspects of the invention. In one embodiment, the cover-layer segment is made of a dielectric material. The cover layer may additionally have the function of a barrier against penetration of a metal contained in the first or second interconnect element into surrounding dielectric material.

In one embodiment that is indicative of a selective non-conformal deposition of the cover-layer during fabrication, the cover-layer segment is arranged on a dielectric liner.

The cover-layer segment may form a section of a cover layer that, as a whole, covers a bottom face of a first interconnect opening in a second dielectric layer, which first interconnect opening is filled by the first interconnect element. This embodiment is particularly useful, where the cover layer has additional functions.

In another embodiment, the cover-layer segments covers a top section of a sidewall of the via opening and laterally abuts to a dielectric liner that is arranged between the first interconnect element in the first dielectric layer outside the via opening. In this embodiment, the structural modification introduced by the cover-layer segment in comparison with prior-art techniques is particularly low. Thus, the structure of the first interconnect element is hardly affected by the introduction of the cover-layer segment.

The via material preferably comprises carbon nanotubes or carbon nanowires, which have an orientation of their longitudinal axis in a direction pointing from the first to the second interconnect element. Carbon nanotubes and carbon nanowires are well known as exhibiting a strong anisotropy of their electrical conductivity. The present embodiment has a particularly good electrical conductivity in the via.

A fourth aspect of the invention is formed by an integrated circuit device that contains the interconnect structure of the third aspect of the invention. The integrated-circuit device can be built with particularly small interconnect vias that have very good heat conductive properties and low electrical resistance.

Preferred embodiments of the invention are also defined in the dependent claims. It shall be understood that the method of the first aspect of the invention and the interconnect structure of the second aspect of the invention have similar and/or identical preferred embodiments as defined in the dependent claims. In particular, device embodiments have method aspects, which define further embodiments of the method of the first aspect of the invention, and method embodiments vice versa have device aspects, which define further embodiments of the device of the second aspect of the invention.

BRIEF DESCRIPTION OF THE DRAWINGS

The invention will now be explained in more detail with reference to the drawings in which.

DETAILED DESCRIPTION OF EMBODIMENTS

FIGS. 1-6 show schematic cross-sectional views of a segment of an interconnect structure 100 during different processing stages according to a first embodiment. An interconnect structure 100 that is disposed on a substrate (not shown) comprises a first interconnect element 102 such as a metal line on a first interconnect level 104, which in the following is also referred to as the lower interconnect level. The first interconnect element 102 is made of an electrically conductive material, typically a metal such as copper Cu. However, alternative electrically conductive materials may be used in the interconnect element 102, such as aluminum (Al), polycrystalline silicon (Si) or tungsten (W), or a combination of the mentioned materials.

Figure 1:
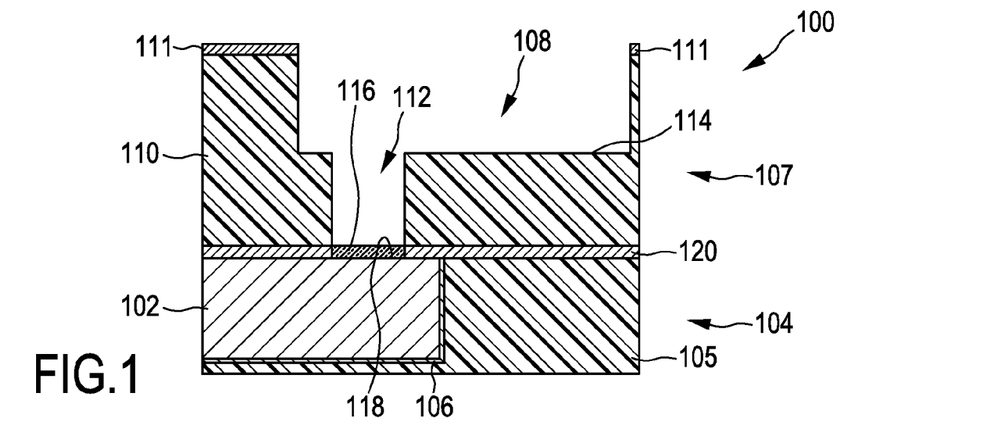
FIGS. 1-6 show schematic cross-sectional views of a segment of an interconnect structure during different processing stages according to a first embodiment.

The first interconnect element 102 is laterally embedded into a lower dielectric layer 105, which in the previous description and in the claims is referred to as the second dielectric layer. A barrier layer 106 separates the electrically conductive material of the interconnect element 102 from the lower dielectric layer 105. In the present example, where Cu is used, the barrier layer, for instance made of TaN or Ta, prevents a penetration of Cu into the lower dielectric layer. Note that the barrier layer need not be present in other metal integration schemes that do not employ Cu in the interconnect elements.

The interconnect structure 100 further contains a second interconnect level 107, which in the following is also referred to as the upper interconnect level. On the upper interconnect level 107 an interconnect opening 108 is formed in an upper dielectric layer 110 for fabrication of a second interconnect element. The upper dielectric layer has also been referred to as the first dielectric layer in the previous description and in the claims. A top layer 111 is deposited on the upper dielectric layer 110 outside the interconnect opening 108.

A via opening 112 is formed in a bottom face 114 of the interconnect opening 108. The via opening 112 extends in the upper dielectric layer between a bottom face 114 of the opening 108 and the first interconnect element 102.

A catalytic layer 116 that has previously been deposited on a bottom face 118 of the via opening 112. The catalytic layer 116 is suitable for supporting growth of carbon nanostructures on the bottom face 118. The catalytic layer 116 contains a catalyst, which is suitably a transition metal, particularly chosen from, but not limited to the elements chromium (Cr), molybdenum (Mo), tungsten (W), iron (Fe), cobalt (Co), nickel (Ni), ruthenium (Ru), rhodium (Rh), palladium (Pd), osmium (Os), iridium (Ir) and platinum (Pt), or manganese (Mn) or mixtures thereof. Metals from the lanthanide and actinide series (for example yttrium (Y)) may also be used. Preferred are Fe, Ni, Co, Mo and mixtures thereof such as a 50/50 mixture (by weight) of Ni and Co, or a mixture of Fe and Ni, or a mixture of Fe and Mo. Any of these transition metals individually or in combination with any of the other transition metals listed may be used in clusters to serve as a catalyst for carbon nanotube growth. Catalysts can also be mixtures of two or more of the listed metals.

A barrier liner 120 is deposited between the interconnect element 102 and the upper dielectric layer 110.

Figure 2:
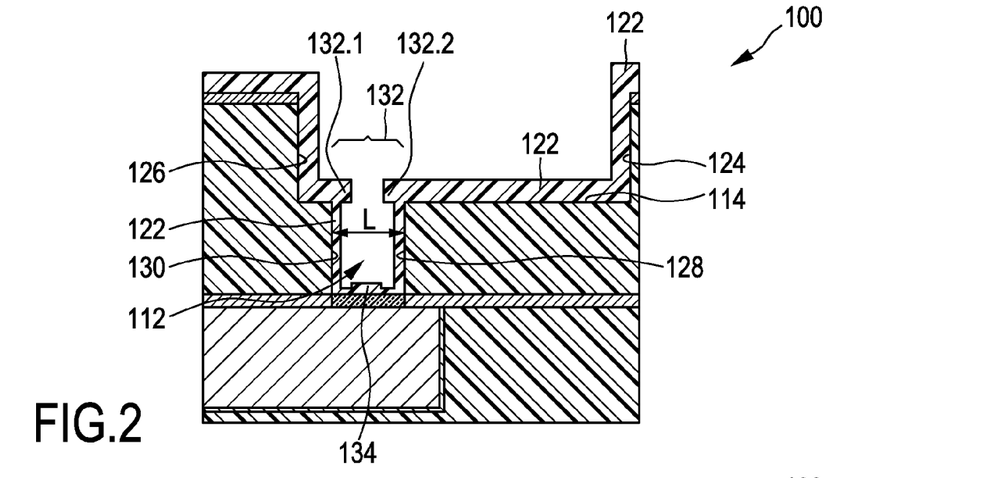

Turning to FIG. 2, a cover layer 122 is deposited by a non-selective and non-conformal deposition technique, for instance a non-selective and non-conformal chemical vapor deposition (CVD) technique, on top of the structure of FIG. 1. The cover layer 122 is made of a dielectric material, such as SiN, SiCN, or SiC. These dielectric materials are typically deposited as thin layers. In other embodiments, a low-k-dielectric material such as, for example, SiC, or a high-k-dielectric material is used, such as, for example $Al_2O_3$, or $HfO_2$. Finally it is also possible to use a metallic layer, such as TaN or Ta as the cover layer, since the material remains at pattern sidewalls. The cover 122 layer is deposited on side faces 124 and 126 as well as a bottom face 114 of the interconnect opening 108. The cover layer 122 is also deposited in the via opening 112 on via side walls 124 and 126, and on a bottom face 118 of the via opening 112. In particular, a cover-layer segment 132 has been fabricated during the non-conformal deposition step as an integral part of the cover layer 122. The cover-layer segment 132 reaches into a lateral extension L of the via opening 112, overhanging parts of the via opening 112. In the cross-sectional view of FIG. 2, the cover-layer segment 132 has two wings 132.1 and 132.2 in the cross-sectional view of FIG. 1. In a top view (not shown), the cover-layer segment can form a ring or an open rectangle. However, it is also possible to only provide the lateral wings 132.1 and 132.2 shown in FIG. 2. In general, any cover-layer segment is suitable that defines an aperture A over the via opening, which is smaller than the lateral extension L of the via opening and is small enough to prevent a penetration of the carbon nanostructures through the via aperture. In the example of FIG. 2 the aperture A is arranged in the center of the via opening. However, the aperture A need not be centered with respect to the via opening.

In one embodiment the aperture is between 20 and 60 nm wide. In an exemplary embodiment, the aperture has a width of 60 nm or less. In another exemplary embodiment, the aperture is 50 nm or less. As explained above, the width of the aperture depends on the lateral extension of the carbon nanostructures, which are to be fabricated in the via opening in a subsequent step.

The non-conformal deposition step that has been performed leads to a stronger deposition of cover-layer material underneath the aperture A on the catalytic layer 116 on the bottom face 118 of the via opening, as indicated by hillock 134.

Figure 3:
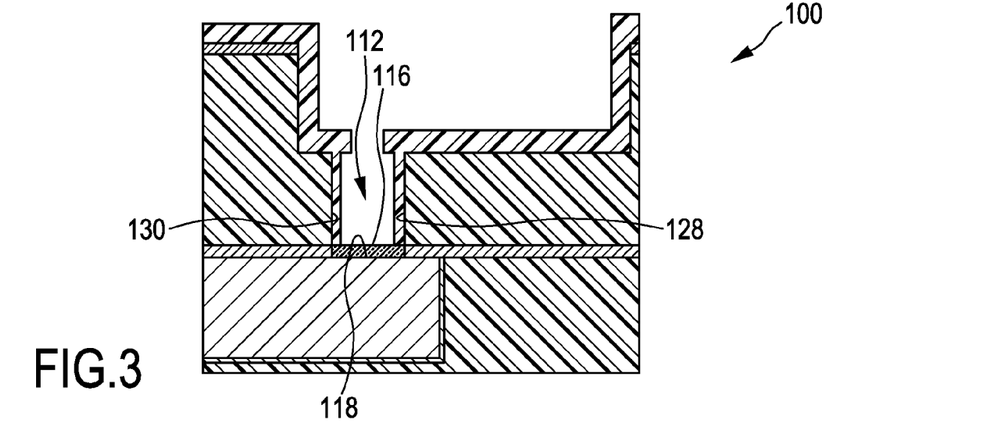

In a subsequent processing step, the result of which is shown in FIG. 3, the cover-layer hillock 134 has been removed from the catalytic layer 116 on the bottom face 118 of the via opening 112. This can be achieved with a reactive ion etching (RIE) process in association with a wet dip. This way, the initial surface of the catalytic layer 132 is completely recovered. This processing step thins the cover layer 122 down also on the side walls 128 and 130 of the via opening 112. The thickness of the cover layer on the bottom face 114 of the interconnect opening 108 is also somewhat reduced during this processing step.

Figure 4:
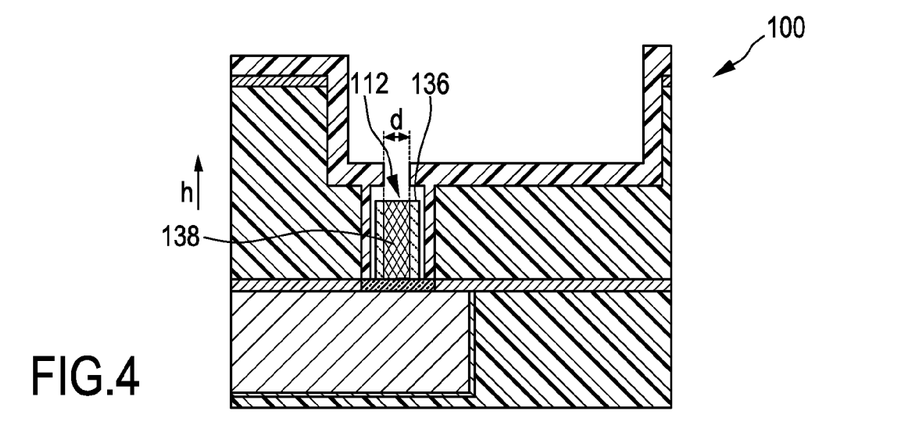
Figure 5:
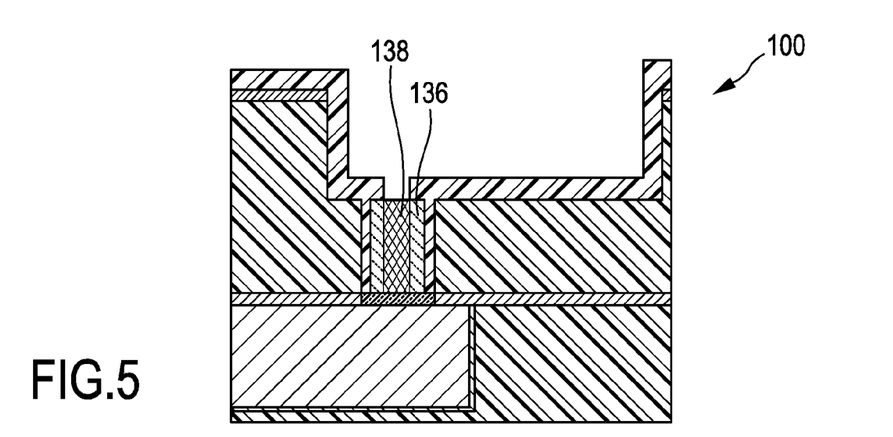
Figure 6:
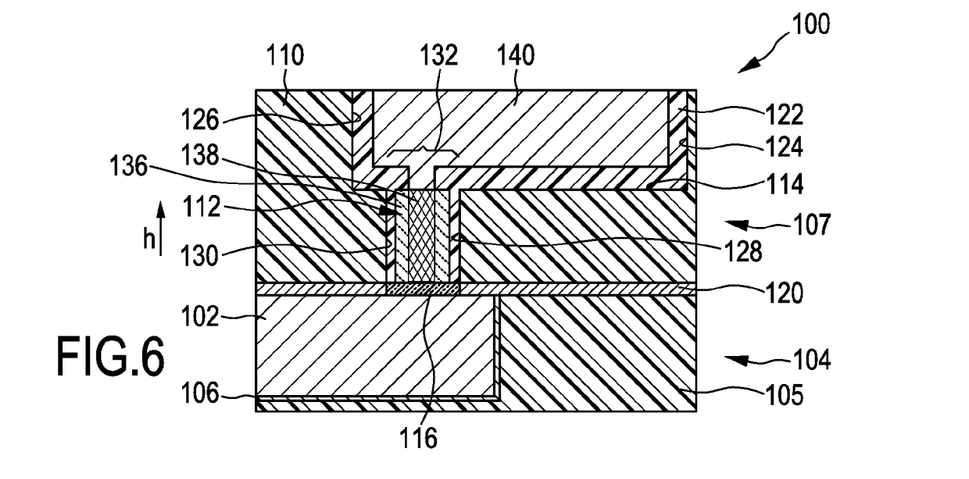

Subsequently, as shown in FIG. 4, growth of a via material 136 is performed inside the via opening 120. The via material 136 deposited contains carbon nanostructures 138 in the form of carbon nanotubes or carbon nanowires. Preferably, a chemical vapor deposition process is used for deposition of the via material 136. The parameters of the CVD Process are set so as to create electrically conductive cylindrical carbon nanostructures, schematically indicated in the Figure, which have a diameter d, which for instance is larger than the aperture A. Generally speaking, the diameter of the carbon nanostructures 138 is so large that a penetration of the carbon nanostructures through the aperture A formed by the cover-layer segment 132 does not take place. Growth conditions during the present CVD step are set so as to comply with this requirement. Thus, when the carbon nanostructures 138 reach the cover-layer segment 132, the growth in a height direction h automatically stops and is optionally continued for enabling growth on the lateral sides that are not arranged underneath the aperture A, for instance until the via opening 112 is completely filled. This processing stage is shown in FIG. 5.

Subsequently, the interconnect opening 108 is filled with interconnect material, such as a material mentioned above for interconnect element 102, to form a second interconnect element 140. Furthermore, a step of chemical mechanical polishing (CMP) is performed that removes the cover layer 122 and parts of the underlying top layer 111 outside the second interconnect element 140.

The processing of the present embodiment can be repeated on higher interconnect levels of an interconnect stack.

FIGS. 7-11 show schematic cross-sectional views of a segment of an interconnect structure during different processing stages according to a second embodiment.

The following description of the processing starts from an interconnect structure 200 in a processing stage that is similar to that of FIG. 1. The present description uses reference labels that have identical last two digits in comparison for those of FIGS. 1-6 for corresponding structural elements. For instance, the cover layer, which was labeled 122 in FIGS. 1-6 is labeled 222 in FIGS. 7-12. Thus, reference is made to the detailed description of the previous embodiment for an explanation of the general structure of the interconnect structure 200. The following description focuses on differences in comparison with the previous embodiment.

Figure 7:
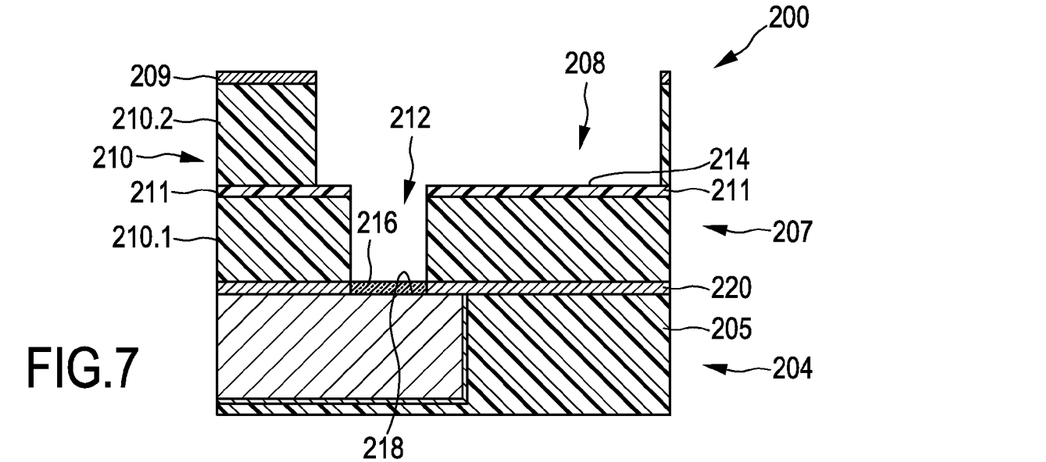
FIGS. 7-11 show schematic cross-sectional views of a segment of an interconnect structure during different processing stages according to a second embodiment.

In contrast to the interconnect structure 100 of FIG. 1, the interconnect structure 200 of FIG. 7 has an upper dielectric layer 210, which is divided into an interlevel dielectric layer 210.1 and an intralevel dielectric layer 210.2 by a dielectric liner 211. The dielectric liner 211 is useful in a selective non-conformal CVD process for a deposition of a cover layer 222. Therefore, fabrication of the interconnect opening 208 in the upper dielectric layer 210 in a previous step has stopped with uncovering the dielectric liner 211.

By providing the dielectric liner 211 on the bottom face 214 of the interconnect opening and by employing suitable deposition conditions in a processing step for deposition of the cover layer 222, deposition selectivity is achieved between the dielectric liner 211 (deposition of the cover layer is successful) and the catalytic layer 216 (deposition of the cover layer fails). In the present embodiment, the selectivity is also achieved with respect to top layer 209, which is also spared from cover-layer deposition. This way, the CMP step performed later is made easier.

The cover layer 222 furthermore does not cover the side walls 224 and 226 of the interconnect opening 208, nor is it present on side walls 228 and 230 of the via opening 212 in the interlevel dielectric layer 210.1.

Figure 8:
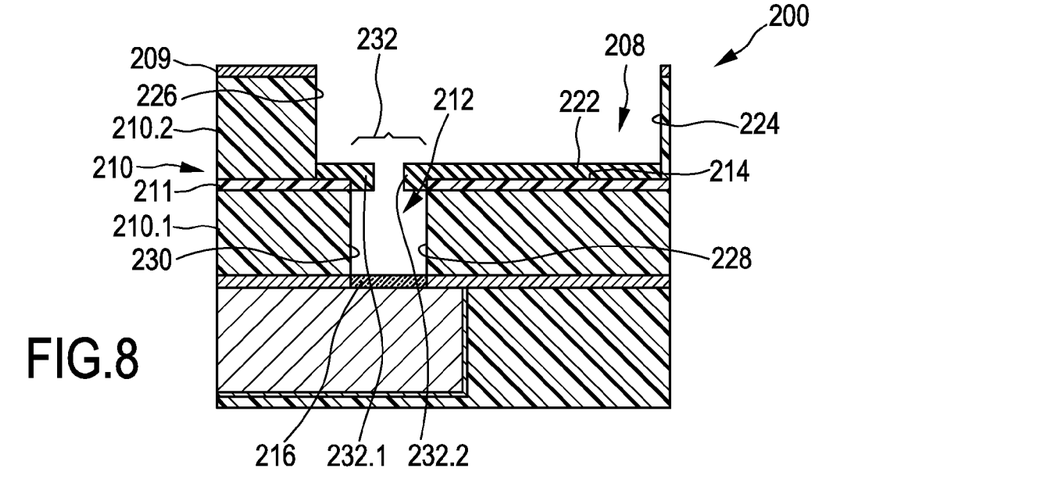

However, the cover layer 222 forms an overhanging cover-layer segment 232 with two wings 232.1 and 232.2 in top sections lateral ends of the via opening 212, cf. FIG. 8.

Figure 9:
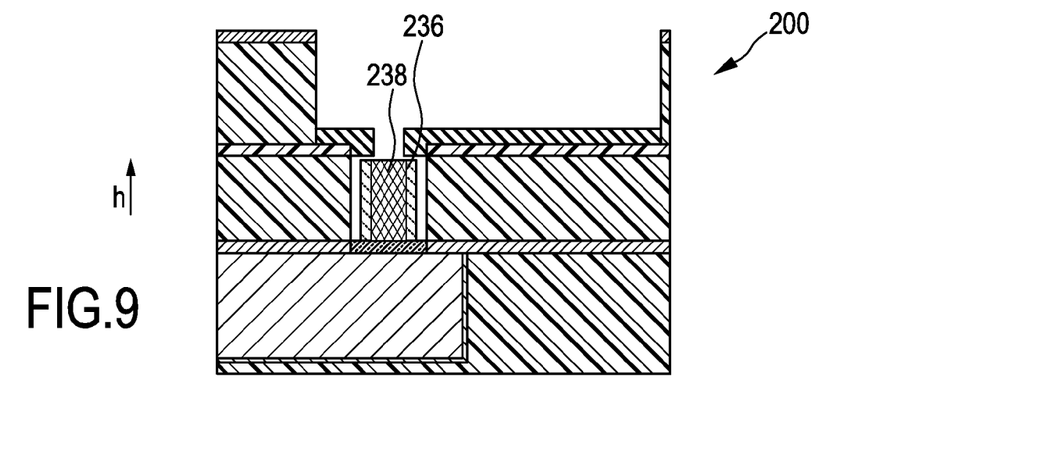
Figure 10:
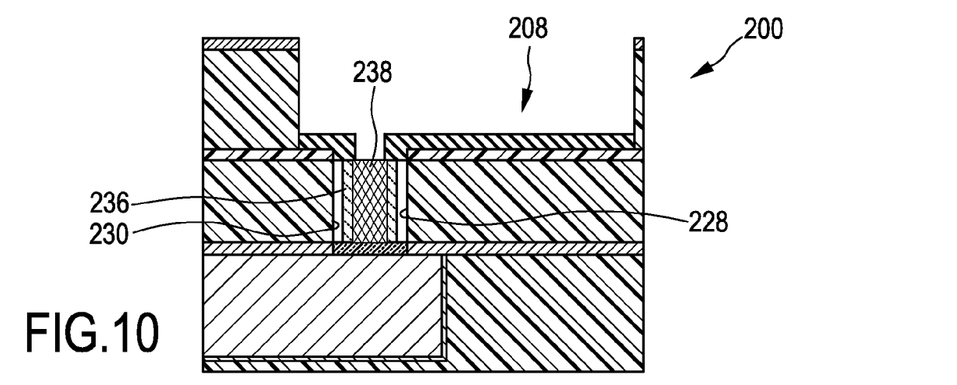

Subsequently, the processing continues as in the previous embodiment. That is, the growth of a via material 236 containing carbon nanostructures 238 is performed in the height direction h until the cover-layer segment 232 is reached (FIG. 9).

Figure 11:
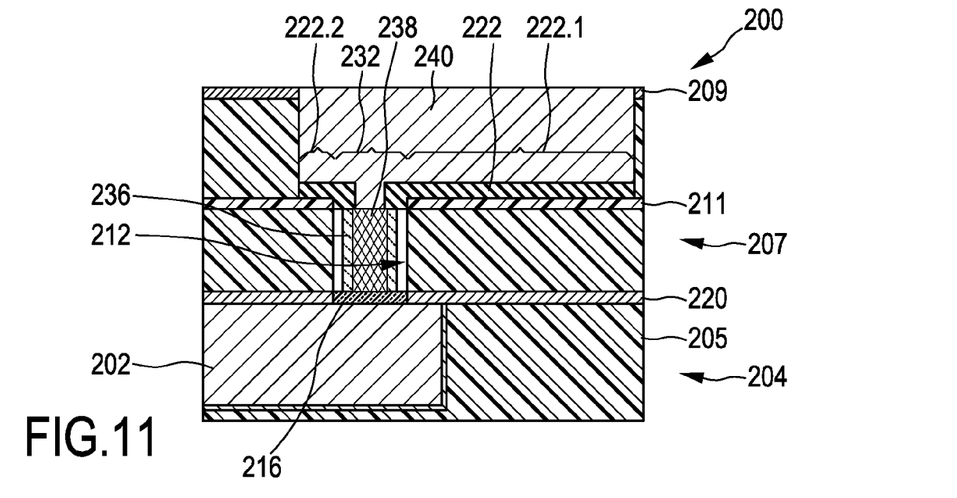

The growth is then continued to a desired lateral extension of the via material 236 (FIG. 10), which may comprise leaving air gaps between the via material 236 and the sidewalls of the via opening, followed by deposition of metal in the interconnect opening 208, leading to the formation of the second interconnect element 240 (FIG. 11).

Figure 12:
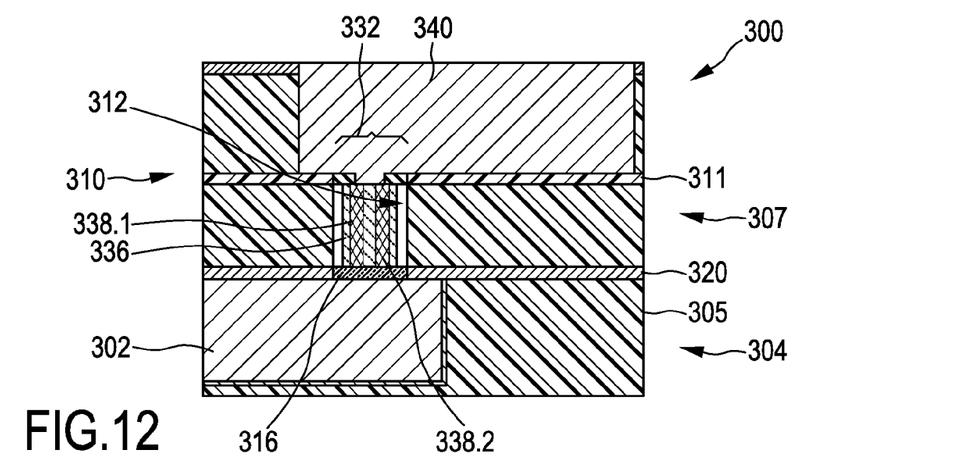
FIG. 12 shows a schematic cross-sectional view of a segment of an interconnect structure according to a third embodiment.

FIG. 12 shows a schematic cross-sectional view of a segment of an interconnect structure 300 in a processing stage corresponding to that of FIG. 11 according to a third embodiment. The present description uses reference labels that have identical last two digits in comparison for those of FIGS. 1-6 and FIGS. 7-11 for corresponding structural elements. Thus, reference is made to the detailed description of the previous embodiments for an explanation of the general structure of the interconnect structure 300. The following description focuses on differences in comparison with the previous embodiments.

The alternative processing represented her involves a removal of cover-layer sections 222.1 and 222.2 (cf. FIG. 11) outside the lateral extension of the via opening 212, for instance by reactive ion etching to form cover-layer section 332. Subsequently, the interconnect element 340 is formed by metal deposition.

In FIG. 12, a situation is represented, in which the via aperture is larger than the diameter of cylindrical carbon nanostructures 338.1 and 338.2. However, due to the lateral arrangement of the nanostructures, at least a fraction of the diameter abuts the cover-layer section 332 from underneath, which halts further growth during fabrication. It is possible to control the lateral arrangement of the nanostructures 338.1 and 338.2 by laterally structuring the catalytic layer 316.

Note that the three embodiments described use a standard metallization scheme for forming the interconnect elements, which is based on dual damascene processing. However, any metallization integration scheme proposed for metal interconnect elements can be used.

While the invention has been illustrated and described in detail in the drawings and foregoing description, such illustration and description are to be considered illustrative or exemplary and not restrictive; the invention is not limited to the disclosed embodiments. In particular, the invention can be used beyond the context of interconnect structures and provides an enhanced control of the growth of carbon nanotubes or carbon nanowires also in other application fields. Other application examples are conductive trenches, embedded for instance in Silicon, or vias between different metal levels on a circuit board.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Any reference signs in the claims should not be construed as limiting the scope.

The invention claimed is:

1. An interconnect structure on a substrate, with electrically conductive interconnect elements on at least two interconnect levels on or above a substrate level, wherein
at least one electrically conductive via connects a first interconnect element on one interconnect level or on the substrate level to a second interconnect element on a different interconnect level, the via extending in a via opening of a first dielectric layer and comprising an electrically conductive via material that contains electrically conductive cylindrical carbon nanostructures, and wherein
at least one cover-layer segment reaches into a lateral extension of the via opening and defines a via aperture over the via opening, wherein the via aperture is small enough to prevent a penetration of the carbon nanostructures through the via aperture.

2. The interconnect structure of claim 1, wherein the via material comprises carbon nanotubes or carbon nanowires, and wherein the via aperture is smaller than or equal to twice an outer cylinder diameter of a single carbon nanotube or carbon nanowire.

3. The interconnect structure of claim 1, wherein the via material comprises carbon nanotubes or carbon nanowires, and wherein the via aperture is smaller than or equal to an outer cylinder diameter of a single carbon nanotube or carbon nanowire.

4. The interconnect structure of claim 1, wherein the at least one cover-layer segment is arranged at a first via end of the via, which is more distant from the substrate than a second via end of the via.

5. The interconnect structure of claim 1, wherein the via material in the via opening is seated on a catalytic layer, which is suitable for supporting growth of the carbon nanostructures.

6. The interconnect structure of claim 1, wherein the cover-layer segment is made of a dielectric material.

7. The interconnect structure of claim 1, wherein the cover-layer segment is arranged on a dielectric liner.

8. The interconnect structure of claim 1, wherein the cover-layer segment covers a top section of a sidewall of the via opening and laterally abuts to a dielectric liner that is arranged between the second interconnect element and the first dielectric layer outside the via opening.

9. The interconnect structure of claim 1, wherein the cover-layer segment forms a section of a cover layer that covers a bottom face of a first interconnect opening in the first dielectric layer, which interconnect opening is filled by the second interconnect element.

10. The interconnect structure of claim 1, wherein the via material comprises carbon nanotubes or carbon nano wires, which have an orientation of their longitudinal axis in a height direction pointing from the first to the second interconnect element.

11. A method for fabricating an interconnect structure that has a via connecting a first electrically conductive interconnect element on one interconnect level or on the substrate level and a second interconnect element on a different interconnect level, comprising the steps of:
providing a substrate with the first interconnect element on one interconnect level or on the substrate level;
depositing a first dielectric layer on the first interconnect element;
fabricating, in the dielectric layer, a via opening that reaches to the first interconnect element;
fabricating a cover-layer segment on the first dielectric layer that reaches into a lateral extension of the via opening and defines a via aperture over the via opening;
fabricating an electrically conductive via material that contains electrically conductive cylindrical carbon nanostructures in the via opening; and
fabricating the second interconnect element that contacts the via;
wherein the via aperture is made small enough to prevent a penetration of the carbon nanostructures through the via aperture.

12. The method of claim 11, comprising, before the step of fabricating the via material in the via opening, a step of fabricating a catalytic layer, which is suitable for supporting growth of the carbon nanostructures, on a bottom face of the via opening.

13. The method of claim 11, wherein the step of fabricating a cover-layer segment on the first dielectric layer comprises: non-conformally depositing a cover layer on a top face of the first dielectric layer.

14. The method of claim 12, wherein the cover layer is selectively deposited, thus avoiding a deposition of the cover-layer material on a bottom face of the via opening.

15. The method of claim 12, comprising a step of removing cover-layer material, which has been deposited during the step of non-conformally depositing the cover layer, from a bottom face of the via opening.

16. The method of claim 11, comprising a step of removing the cover layer from the top face of the first dielectric layer outside the via opening.

17. The method of claim 11, wherein the deposition of the via material in the via opening is sustained in height until the via material abuts to the cover-layer segment.

18. The method of claim 11, which is performed as a part of a single- or dual-damascene process.

19. A method for fabricating an integrated-circuit device, comprising a step of fabricating an interconnect structure by means of the method of claim 11.

20. The interconnect structure of claim 1, wherein the via aperture is smaller than a lateral dimension of the via opening.

\* \* \* \* \*